(12) United States Patent
Coulloudon et al.

(10) Patent No.: US 9,970,976 B2
(45) Date of Patent: May 15, 2018

(54) COMPOSITE INSULATOR FOR AN OVERHEAD POWER LINE WITH A PROTECTED LEAKAGE CURRENT DETECTOR

(71) Applicant: SEDIVER SA, Nanterre (FR)

(72) Inventors: Francois Coulloudon, Paris (FR); Fabien Virlogeux, Belleville sur Allier (FR)

(73) Assignee: SEDIVER SA, Nanterre (FR)

( * ) Notice: Subject to any disclaimer, the term of this patent is extended or adjusted under 35 U.S.C. 154(b) by 0 days. days.

(21) Appl. No.: 15/706,854

(22) Filed: Sep. 18, 2017

(65) Prior Publication Data

US 2018/0106850 A1 Apr. 19, 2018

(30) Foreign Application Priority Data

Oct. 18, 2016 (FR) ...................... 16 60088

(51) Int. Cl.
| | |
|---|---|
| *H01B 17/00* | (2006.01) |
| *G01R 31/08* | (2006.01) |
| *G01R 31/02* | (2006.01) |
| *G01R 31/12* | (2006.01) |
| *H01B 17/32* | (2006.01) |
| *G02B 6/44* | (2006.01) |

(52) U.S. Cl.
CPC ......... *G01R 31/085* (2013.01); *G01R 31/021* (2013.01); *G01R 31/025* (2013.01); *G01R 31/1245* (2013.01); *H01B 17/32* (2013.01); *G02B 6/442* (2013.01)

(58) Field of Classification Search
CPC .. G01R 31/085; G01R 31/021; G01R 31/025; G01R 31/1245; H01B 17/32
USPC ........ 174/137 A, 140 C, 142, 167, 169, 176, 174/178, 179
See application file for complete search history.

(56) References Cited

U.S. PATENT DOCUMENTS

| | | | | | |
|---|---|---|---|---|---|
| 5,214,249 | A | * | 5/1993 | Goch ...................... | H01B 17/06 174/141 R |
| 5,847,325 | A | * | 12/1998 | Gagne .................... | H01B 17/12 174/179 |
| 2016/0209445 | A1 | * | 7/2016 | McCammon ........ | G01R 31/021 |

FOREIGN PATENT DOCUMENTS

| | | |
|---|---|---|
| EP | 2 884 292 A1 | 6/2015 |
| FR | 1 553 917 A | 1/1969 |
| FR | 2 574 979 A1 | 6/1986 |

* cited by examiner

*Primary Examiner* — Tremesha S Willis
(74) *Attorney, Agent, or Firm* — Ware, Fressola, Maguire & Barber LLP

(57) ABSTRACT

A composite insulator (1) for overhead power lines comprises a rigid core extending axially between two attachment fittings (6) and having placed thereon a shell having sheds (5, 5') made of electrically insulating synthetic material. It includes a detector device for detecting surface leakage currents, which device includes an electrically conductive metal annular ring (7) surrounding the shell between an end shed (5') adjacent to one of the two fittings (6) and another shed (5) adjacent to the end shed (5') that extends radially over the ring (7). The ring (7) is connected by a conductive wire (8) passing through the end shed (5') to be connected to an electronic unit (9) of the detector device.

4 Claims, 1 Drawing Sheet

US 9,970,976 B2

COMPOSITE INSULATOR FOR AN OVERHEAD POWER LINE WITH A PROTECTED LEAKAGE CURRENT DETECTOR

CROSS REFERENCE TO RELATED APPLICATION

This application claims priority under 35 USC § 119 to French Patent Application No. 1660088 filed on Oct. 18, 2016, which application is hereby incorporated by reference in its entirety.

TECHNICAL FIELD

The field of the invention is that of insulators for high and very high voltage overhead power lines.

The invention relates in particular to a composite insulator for overhead power lines, the insulator comprising a rigid core extending axially between two attachment fittings and having placed thereon a shell having sheds made of electrically insulating synthetic material.

PRIOR ART

Insulators for overhead power lines serve to suspend power lines in the air from a pylon.

An insulator for overhead power lines is generally in the form of a string of dielectric elements.

Composite insulators for overhead power lines comprise a rod made of glass fibers having molded or threaded thereon a shell forming sheds in the shape of upside down dinner plates and made of electrically insulating synthetic material.

It is known that such insulators for overhead power lines are subjected to bad weather, e.g. rain or saline mist, and to air pollution, whether of natural or of industrial origin, and also to grains of material that can become deposited on the surfaces of insulators.

When the layer of dirt becomes wet, it transforms into a conductive electrolyte that can give rise to a surface leakage current flowing over the surface of the insulator.

Under such circumstances, insulators are no longer effective and they tend to age prematurely.

Thus, manufacturers seek to detect and measure surface leakage currents on installations of this type.

Patent document EP 2 884 292 describes a device for detecting surface leakage currents on cap-and-pin type insulators made of glass or ceramic.

That device comprises a detector unit that can be mounted on the dielectric element at the top of the string of dielectric elements of the insulator for overhead power lines.

That known device has a first conductive ring that is fastened around the cap and that is in contact with the dielectric surface, a second conductive ring for grounding that is fastened around the cap above the first ring, and an electronic measurement unit connected to both the conductive rings in order to detect and measure the leakage current.

That arrangement presents the drawback of also being subjected to air pollution and rain, in particular the conductive rings are directly exposed to environmental conditions, e.g. rain.

As a result, the device for detecting and measuring surface leakage currents on the surface of dielectric elements can present detection and measurement failures.

That is why the manufacturers of insulators for overhead power lines seek to develop insulators including surface leakage current detector devices that are more reliable.

SUMMARY OF THE INVENTION

The object of the invention is thus to propose an insulator for overhead power lines, specifically an insulator of composite type, and including a detector device for detecting surface leakage currents of another design.

To this end, the invention provides a composite insulator for overhead power lines, the insulator comprising a rigid core extending axially between two attachment fittings and having placed thereon a shell having sheds made of electrically insulating synthetic material, the insulator being characterized in that it includes a detector device for detecting surface leakage currents, the device comprising an electrically conductive metal annular ring surrounding the shell between an end shed adjacent to one of the two fittings and another shed adjacent to the end shed, the end shed of the shell extending radially over the ring, and the ring being connected to a conductive wire that passes through the end shed of the shell to be connected to an electronic circuit of the detector device.

The composite insulator of the invention for overhead power lines may present the following features:

the ring may be a removable band; and in a composite insulator for overhead power lines having a predefined number, N, of sheds to obtain a certain leakage line characteristic of the insulator, provision may be made for the end shed to be a shed that is additional to the N sheds.

The idea on which the invention is based is thus to add an additional shed in the string of sheds constituting the synthetic insulating shell of a composite insulator and to place the conductive ring of the surface leakage current measurement device under the additional shed.

When the composite insulator is in operation, the insulator extends substantially vertically and the additional shed adjacent to the top fitting anchored to the pylon thus lies above the other sheds of the insulator and serves as an umbrella to the ring in order to protect it from trickling water.

This additional shed has an electric wire of the detector device passing therethrough. Nevertheless, since it is an additional shed, that does not modify the electrical insulation of the line.

The additional shed needs to be mounted on the core of the insulator on an initial assembly because the length of the core needs to be adapted so as to be capable of receiving the additional shed.

BRIEF DESCRIPTION OF THE DRAWINGS

The present invention can be better understood and other advantages appear on reading the following description and the accompanying drawing, in which.

DESCRIPTION OF EMBODIMENTS

Figure 1:
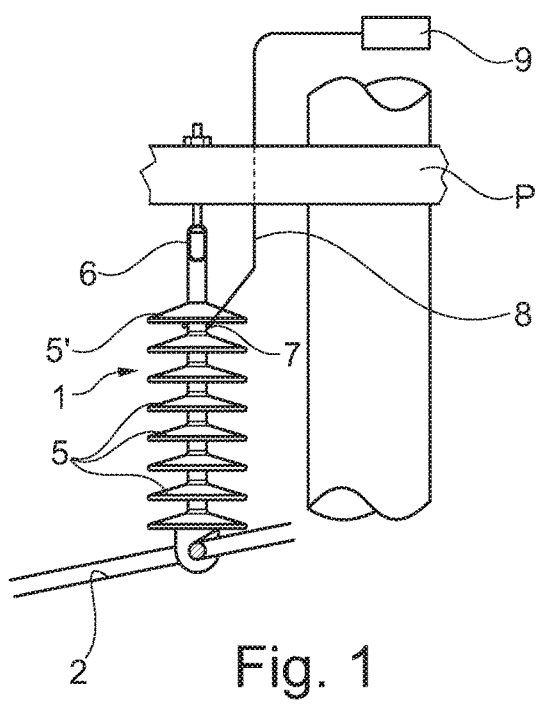
FIG. 1 is a diagrammatic view of a composite insulator for overhead power lines shown on a pylon for supporting an overhead power line.

FIG. 1 is highly diagrammatic and shows a composite suspension insulator 1 made up of a string of molded dielectric elements 5, 5' capable of suspending a high voltage overhead power line 2 in the air from a pylon P.

Figure 2A:
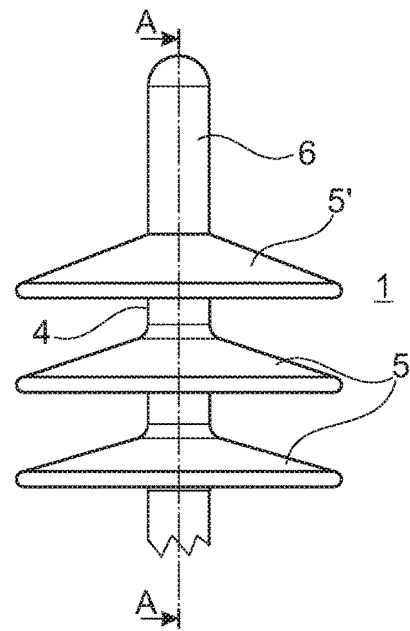
FIG. 2A is a diagram showing a portion of a composite type dielectric element.
Figure 2B:
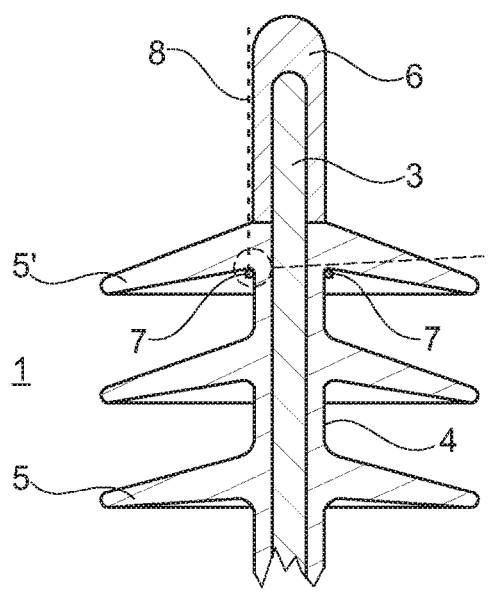
FIG. 2B is an axial section view of the portion of a FIG. 2A composite type dielectric element with an end shed fitted with a conductive annular ring.

As shown in FIGS. 2A and 2B, the insulator 1 comprises a core 3 in the form of a rod that is rigid and that extends between two metal attachment fittings 6, including the attachment fitting that is fastened to the pylon.

The rod may be made of resin-impregnated glass fibers, giving the insulator 1 its mechanical strength.

The insulator 1 has a shell 4 made of electrically insulating synthetic material that is placed on the rod and that forms sheds.

The shell 4 may be made of cycloaliphatic resins, out of synthetic rubbers such as silicones or ethylene propylene diene monomer (EPDM), or indeed out of polytetrafluoroethylenes (Teflon).

The shell 4 may be molded directly onto the rod or it may be threaded onto the rod.

The insulator 1 shown in FIG. 1 in this example has seven sheds given the reference 5 and they are arranged in series so as to ensure the characteristic line of leakage for the insulator 1, together with an additional shed that is given the reference 5', which is at the end of the insulator 1 closest to the pylon P.

This end shed 5' does not contribute to providing the characteristic leakage line for the insulator 1. This end shed 5' serves as an umbrella for an annular ring 7 of a device for detecting surface leakage currents that might flow on the outside surface of the shell 4.

The ring 7 is an electrically conductive metal ring that is clamped around the shell 4 between the end shed 5' and the shed 5 adjacent thereto.

The ring 7 is pressed against the bottom surface of the end shed 5' in order to intercept the surface leakage current (of a few milliamps) that passes towards the fitting 6.

The end shed 5' thus extends radially, overlying the ring 7 like an umbrella.

The ring 7 is connected by an electrically conductive wire 8 to an electronic unit 9 of the detector device, e.g. an electronic circuit for transforming the leakage current into a voltage, the electronic unit 9 subsequently supplying the voltage signal to a measurement unit that may be remote from the electronic unit 9 itself.

As can also be seen in FIG. 2B, the end shed 5' has the wire 8 passing therethrough so as to run along the fitting 6.

The ring 7 is a removable band of a band clamp, thus enabling it to be replaced during a maintenance operation, for example.

Figure 2C:
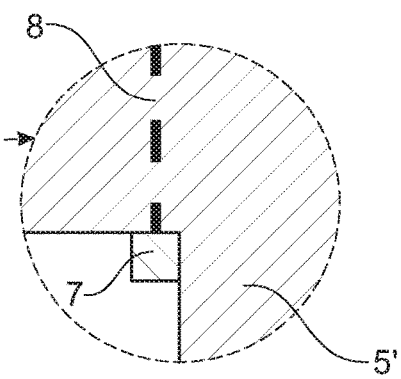
FIG. 2C is a detail (enlarged) view in axial section of the end shed shown in FIG. 2B.

As shown in FIG. 2C, the ring 7 may be square in section so as to present an inside peripheral surface that is directly in contact both with the cylindrical outside surface of the shell 4 between two sheds 5, and with the annular outside surface of the end shed 5'.

Because of the shaped outside peripheral edge of the end shed 5', rain water trickles naturally under gravity without reaching the ring 7, which is thus well protected.

What is claimed is:

1. A composite insulator for overhead power lines, the insulator comprising a rigid core extending axially between two attachment fittings and having placed thereon a shell having sheds made of electrically insulating synthetic material, the insulator including a detector device for detecting surface leakage currents, the device comprising an electrically conductive metal annular ring surrounding said shell between an end shed adjacent to one of said two fittings and another shed adjacent to said end shed, said end shed extending radially over said ring, and said ring being connected to a conductive wire that passes through said end shed to be connected to an electronic unit of said detector device.

2. The composite insulator for power lines according to claim 1, wherein said ring is a removable band.

3. The composite insulator for power lines according to claim 2, wherein the insulator is provided with a number, N, of sheds defining a certain leakage current characteristic of the insulator, with said end shed being a shed that is additional to said N sheds.

4. The composite insulator for power lines according to claim 1, wherein the insulator is provided with a number, N, of sheds defining a certain leakage current characteristic of the insulator, with said end shed being a shed that is additional to said N sheds.

* * * * *